(12) United States Patent
Coyle

(10) Patent No.: US 6,753,616 B2
(45) Date of Patent: Jun. 22, 2004

(54) FLIP CHIP SEMICONDUCTOR DEVICE IN A MOLDED CHIP SCALE PACKAGE

(75) Inventor: Anthony L. Coyle, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/320,585

(22) Filed: Dec. 16, 2002

(65) Prior Publication Data

US 2003/0092217 A1 May 15, 2003

Related U.S. Application Data

(62) Division of application No. 09/776,465, filed on Feb. 2, 2001, now Pat. No. 6,518,089.

(51) Int. Cl.$^7$ .............................................. H01L 23/28
(52) U.S. Cl. ...................................... 257/787; 257/778
(58) Field of Search ................................. 257/778, 787

(56) References Cited

U.S. PATENT DOCUMENTS

| | | |
|---|---|---|
| 5,397,917 A | 3/1995 | Ommen et al. |
| 6,075,710 A * | 6/2000 | Lau ............................. 361/760 |
| 6,150,724 A | 11/2000 | Wenzel et al. |
| 6,252,301 B1 * | 6/2001 | Gilleo et al. .................. 57/690 |
| 6,287,890 B1 | 9/2001 | Ho |
| 6,339,254 B1 * | 1/2002 | Venkateshwaran et al. . 257/686 |
| 6,521,485 B2 * | 2/2003 | Su et al. ...................... 438/114 |

* cited by examiner

*Primary Examiner*—David Nelms
*Assistant Examiner*—Thao P. Le
(74) *Attorney, Agent, or Firm*—Bret J. Petersen; W. James Brady, III; Frederick J. Telecky, Jr.

(57) ABSTRACT

A robust, low inductance electronic package for small area semiconductor chips is provided which includes a flexible polymer film having electronic circuitry on one or more major surfaces, a bumped flip chip integrated circuit attached to the first surface, an array of solder balls to the second surface, and the device encapsulated in a plastic molding compound. An assembly and packaging method is disclosed wherein multiple devices are encapsulated simultaneously on a continuous polymer film, thereby providing a method compatible with high volume and low cost manufacturing processes and equipment.

16 Claims, 3 Drawing Sheets

US 6,753,616 B2

FLIP CHIP SEMICONDUCTOR DEVICE IN A MOLDED CHIP SCALE PACKAGE

This application is a division of the application Ser. No. 09/776,465, filed on Feb. 2, 2001, now U.S. Pat. No. 6,518,089.

FIELD OF THE INVENTION

This invention relates to packaging of a semiconductor device and more particularly to a method for manufacturing an encapsulated flip chip on flex film package.

BACKGROUND OF THE INVENTION

The demand for a reduction in size and an increase in complexity of electronic components has driven the industry to produce smaller and more complex integrated circuits (ICs). These same trends have forced the development of IC packages having smaller footprints, higher lead counts, and better electrical and thermal performance. At the same time, these IC packages are required to meet accepted industry standards.

Ball grid array (BGA) packages were developed to meet the demand for packages having higher lead counts and smaller footprints. A BGA package is typically a square package with terminals, normally in the form of an array of solder balls, protruding from the bottom of the package. These terminals are designed to be mounted onto a plurality of pads located on the surface of a printed circuit board, or other interconnection substrate.

For many applications such as an increasing number of portable electronic components (cellular phones, disk drives, pagers, etc.) even BGA packages are too large. Consequently, solder bumps are sometimes deposited directly onto the IC chip itself and used for attachment to the circuit board (commonly referred to as direct chip attach). However, there are a number of problems associated with this approach, and it has not achieved commercial success.

Another class of packages has been developed to address many of the small size and improved performance issues. This class is referred to as chip scale packages or CSP. Chip scale packages are so called because the total package area is similar to, or not much larger than the size of the IC chip itself. Chip scale packages are similar to BGAs in that solder ball terminals are typically disposed underneath the package area. One example of a CSP is a product developed by Tessera called "MICRO BGA"®. This product consists of a flexible circuit having leads bonded to the chip and with a soft compliant elastomer layer between the chip and the circuit.

Another CSP design, such as Texas Instruments' Micro Star® package illustrated in FIG. 1 includes a semiconductor chip wire bonded to a flexible tape, and the assemblage overmolded using a plastic encapsulant.

As an alternate, Motorola's SLICC and JACS-Pak devices shown in FIG. 2 include a flip chip attached to an organic substrate. Such devices provide a desired electrical performance enhancement due to the very short leads, but lack the robustness of a fully packaged device because the chip back side has no, or only minimal dielectric covering. Pick and place equipment of the end user requires a robust and somewhat standardized package form factor, such as molded plastic packages which have been familiar to the industry for many years.

A comprehensive review of CSP package designs, along with the advantages and shortcomings is given by Lau and Lee (1). John H. Lau and Shi-Wei Ricky Lee, *Chip Scale Package (CSP) Design, Materials, Processes, Reliability, and Applications*, McGraw-Hill, New York, 1999

From a review of the available package designs and manufacturing processes, it is obvious that the industry needs a very small outline package having the low inductance performance advantages offered by flip chip interconnection, a manufacturing technology compatible with high volume and low cost processing, and a robust, user friendly plastic molded package.

SUMMARY OF THE INVENTION

It is an object of the invention to provide a robust molded chip scale package having a chip with bumped flip chip interconnection to a flexible film substrate.

It is an object of the invention to provide a high performance, high speed, low inductance package.

It is further an object of the invention that interconnections on the substrate allow fan-in and fan-out of input/output contacts between the chip contacts and the package contacts so that the length and resistivity of interconnections is minimized.

It is an object that the package be compatible with required reliability standards, and therefore, the package is aimed primarily at small area chips.

It is an object of the invention to provide a manufacturing method amenable to assembly of multiple semiconductor devices in a continuous process flow, and having some steps performed simultaneously.

The objectives of the invention are met by providing an electronic package which includes a flexible polymer film having electronic circuitry patterned on one or both major surfaces, a bumped flip chip integrated circuit attached to the first surface, an array of solder balls to the second surface, and the device encapsulated in a plastic molding compound. An assembly and packaging method for fabrication of such integrated circuit devices wherein multiple devices are encapsulated simultaneously on a continuous polymer film, thereby providing a method compatible with high volume and low cost manufacturing, is disclosed.

DETAILED DESCRIPTION OF THE DRAWINGS

Figure 1:
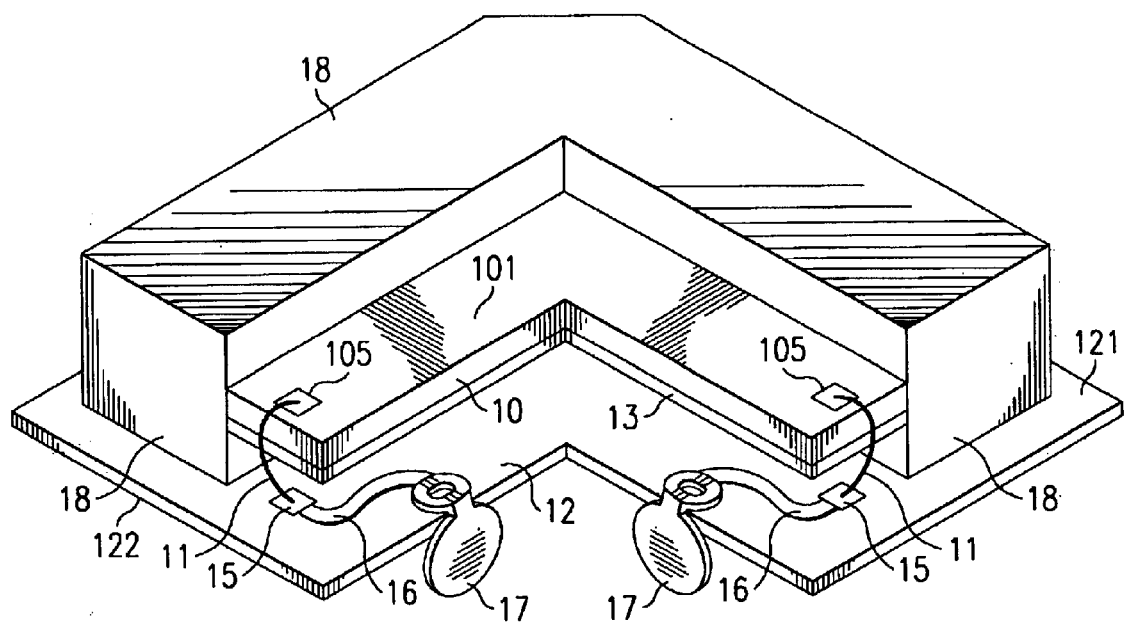
FIG. 1 is a wire bonded chip scale package design of the prior art.

FIG. 1 is a cut away view of a molded chip scale package, Micro-Star® BGA, having an integrated circuit chip 10 positioned with its active surface 101 wire bonded 11 to a flexible tape substrate 12. The flexible tape substrate includes bonding lands 15 and conductive traces 16 on the first or chip side surface 121. The chip 10 is affixed to the flexible tape substrate 12 by a polymeric adhesive 13, and is electrically interconnected to the substrate by wire bonds 11. Vias through the interposer allow connection of the bond wires 11 and conductive traces 16 on the first surface 121 to solder balls 17 on the opposite or second surface 122 of the substrate 12. Solder balls 17 are attached to vias by a solder paste, and are the contacts to a printed circuit board (PCB) or alternate next level of interconnection. An epoxy molding compound 18 encapsulates the top and sides of the chip and the bonding wires, and provide the form factor of a plastic package, as well as environmental and mechanical protection for the device.

It can be seen from FIG. 1 that the package is necessarily larger than the chip in order to include the bond wires 11 and lands 15 within the molded plastic encapsulation 18. It can also be seen that the electrical routing of the circuitry is as follows; chip circuits are routed to bond pads 101 near the chip perimeter by means of thin film wafer processing technology, wire bonds 11 connect the bond pads 101 to lands 15 on the flex tape perimeter, conductors patterned from the bond wire lands are fanned-inwardly by conductive traces 16 on the first surface of the tape to vias located under the chip, and the vias in turn provide connection to an array of solder balls 17. While the package is small, the electrical routing and interconnections contribute to increased inductance, and thus slower operating speed of the device.

Figure 2:
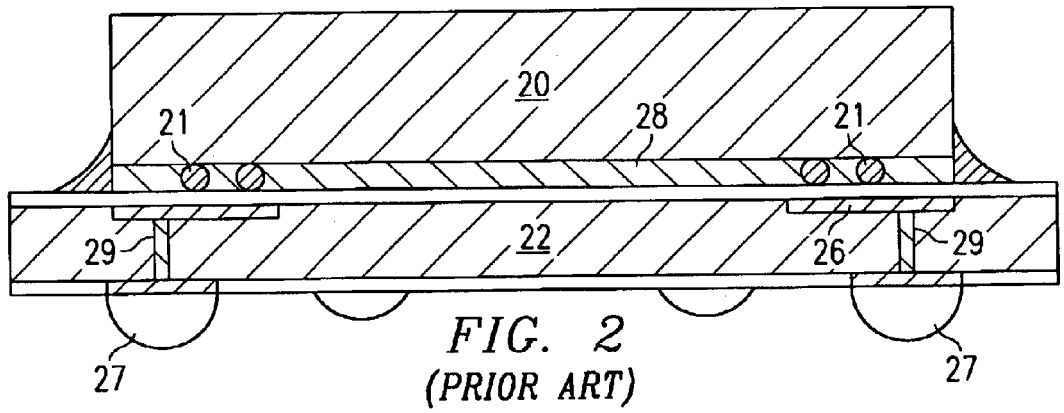
FIG. 2 is a flip chip device of the prior art.

In FIG. 2, a CSP including a flip chip on a substrate or interposer 22 is illustrated. The integrated circuit chip 20 includes a plurality of solder bumps 21 reflow connected to lands and conductive traces 26 on the substrate 22. Vias 29 through the substrate provide a path for connection with solder balls 27 on the opposite side of the substrate. An underfill material 28, typically an epoxy or modified polymer filled with inorganic particles is disposed under the chip to surround the solder bumps 21, and fill the space between chip and substrate. Underfill materials are used in the industry to mitigate stresses on solder joints resulting from mismatch in thermal expansion between silicon chips and printed circuit boards. The device is completed by affixing solder ball 27 package contacts on the opposite side of the substrate. Substrates materials of inorganic, semi-rigid laminate, and flexible films have been reported.

This flip chip device offers the advantages of minimum inductance, and thus provides a potentially high speed packaging concept. However, the bare chip backside has been found to be susceptible to both electrical and mechanical damage. Electrical damage occurs as a result of foreign objects shorting to the semiconductor chip backside, and as a result of ESD. Mechanical damage to the brittle silicon results from handling, which in turn limits the use of automated pick and place equipment. If a thin conformal coating were applied to the chip backside, as has been the case in some CSP devices, it does not eliminate the incompatibility with pick and place equipment. A further problem with the package is damage to the exposed substrate which can readily be peeled from the underfill and chip by mechanical contact and/or flexing.

Preferred embodiments of the device and method claimed in the current disclosure are illustrated in FIGS. 3 through 6, wherein a series of integrated circuit chips having a plurality of solder or other bump contacts are electrically and mechanically attached to a flexible tape or film in strip form. An underfill material is disposed between each chip and tape to add mechanical support to the flip chip contacts. The tape assemblage including a plurality of bonded chips is positioned in a mold press and molding compound injected to cover the sides and backside of the chips, leaving the unassembled surface of the tape exposed for solder balls which serve as package input/output connections. The molded package provides mechanical stability, as well as environmental protection to the device.

This device provides a complete CSP packaging solution having low inductance interconnections, a robust molded package, and capability to meet reliability requirements of small area integrated circuits. As will be discussed later, the manufacturing processes are compatible with very high volume, low cost assembly techniques.

Figure 3:
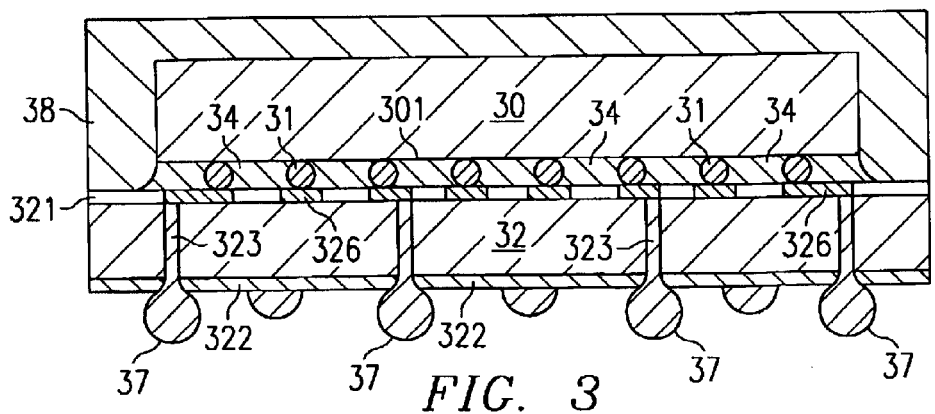
FIG. 3 is a cross sectional representation of a chip scale package of the current invention.

FIG. 3 is a cross-sectional view of a plastic molded chip scale package produced by the method of the invention. An integrated circuit chip 30 having one or more conductive bump 31 contacts affixed to the active surface 301 of the chip is attached to metallized lands on the first surface 321 of a tape interposer 32. An underfill material 34 is disposed between the chip 30 and interposer 32, and surrounds the bump contacts 31. An epoxy molding compound 38 surrounds the chip sides and backside, and is adhered to the exposed first surface of the interposer 32. An array of solder balls 37 are electrically and mechanically attached at the vias to the second surface 321 of the flexible interposer. In the preferred embodiment, a solder paste fills and surrounds the vias 323, thereby providing the attachment and conduction mechanism.

Bump contacts 31 on the chip preferably are eutectic solder spheres. Alternately conductive polymeric bumps, lead free solder bumps, or other pre-formed spheres of a readily solderable material provide contacts. A number of options for bumps which are amenable to processing at temperatures equal to or lower than that of eutectic solder are available in the industry. The bump contacts are preferably arrayed on the active area of the chip surface in a manner which minimizes on-chip bussing, and consequently reduces resistivity of interconnection circuits. Alternately, the bump contacts are positioned near the chip perimeter, or in the center of the chip. Bumps are typically in the range of 15 to 150 microns in diameter.

In the preferred embodiment, the interposer 32 is a flexible dielectric film having a first second major surface with conductive interconnection patterned on the first surface. The dielectric tape 32 is preferably a thermally stable polymer of the polyimide family, commercially available as KAPTON® or Upilex, and is in the range of 15 to 75 microns thick. The conductive patterns 326 on the first surface 321 include a plurality of lands which mirror the chip bump positions, and a series of conductive routing patterns 326 to vias 323 which extend through the tape to the second surface 322. Device specific conductive patterns such as bussing structures for multiple power or ground contacts are included in some embodiments.

A solder paste screened around and into the vias 323 on the second surface 322 provided a mechanism for attaching solder balls and making electrical connection between the chip and package input/output contacts.

In an alternate embodiment, conductive patterns on the second surface 322 include an array of solderable metallized lands at the terminus of vias 323 to which solder balls are attached.

Routing of chip bump interconnections may be fanned inwardly to mate with vias and solder balls, or may be fanned outwardly as needed to minimize length and resistivity of the interconnections. Conductor patterns 326 and lands typically comprise a low resistivity metal, such as copper, in the range of 12 to 40 microns in thickness.

Solder balls 37 are arrayed on the exposed or second surface of the interposer in a pattern consistent with industry standards, and are typically at 0.5 or 0.8 mm pitch.

The preferred embodiment shown in FIG. 3 includes a flexible tape 32 having conductors patterned on the first major surface 321, but it should be recognized that the invention is not limited to this structure, but can also be an interposer having one or more conductive levels.

The embodiment in FIG. 3 includes an underfill material 34 disposed between the chip 30 and interposer 32, and surrounding the bumps 31. Preferably the underfill material is a thermosetting resin, such as an epoxy with inorganic particulate matter to control thermal expansion and thixotropic properties. Underfill materials provide mechanical stability to the device and minimize damage to solder bumps resulting from mismatches in expansion between the silicon chip having a thermal coefficient of expansion of 2.3 PPM and the PCB at typically between 7 and 25 PPM.

As shown in FIG. 3, a plastic molded body 38 surrounds the perimeter and backside of the chip 30, and covers the exposed first surface of the interposer. The molded body is in the range of 0.25 to 0.6 mm in thickness on top of the chip, thus providing a CSP having a total device thickness of less than 1 mm, and having the sides and length about 0.25 to 0.5 mm larger than those of the chip. The molding compound is a thermosetting epoxy resin loaded with inorganic particulate matter.

The rigid plastic encapsulation provides electrical and mechanical protection for the chip, it adheres to the interposer or substrate, thereby avoiding peeling during handling or thermal exposure, and it provides a better thermal match to the PCB than a bare silicon chip. Further, the plastic package provides a familiar and convenient surface for automated pick and place equipment.

The CSP device in FIG. 3 includes a plurality of solder balls 37 with routing to electrically contact the chip, and the balls in turn provided an electrical connection to the next level of interconnection, typically a PCB. Solder balls, are spherical in shape, and are in the range of 0.25 to 0.6 mm in diameter. Solder balls 37 preferably are a eutectic solder, but are not limited to this composition, and instead are consistent with printed circuit board assembly technology, which may include lead free solders.

The molded flip chip CSP of the current invention provides a low inductance interconnection scheme necessary for many high speed integrated circuit devices. The interconnection path of the preferred embodiment includes an area array configuration of low resistivity on-chip bump contacts positioned to minimize bussing by thin film metallization typically used in chip fabrication. Short, broad bump contacts minimize resistivity of the chip to interposer connection, and relatively wide and thick interposer conductors of a very low resistivity material provide a low resistance path to vias. Alternate embodiments of bump contacts include perimeter or center locations.

Figure 4:
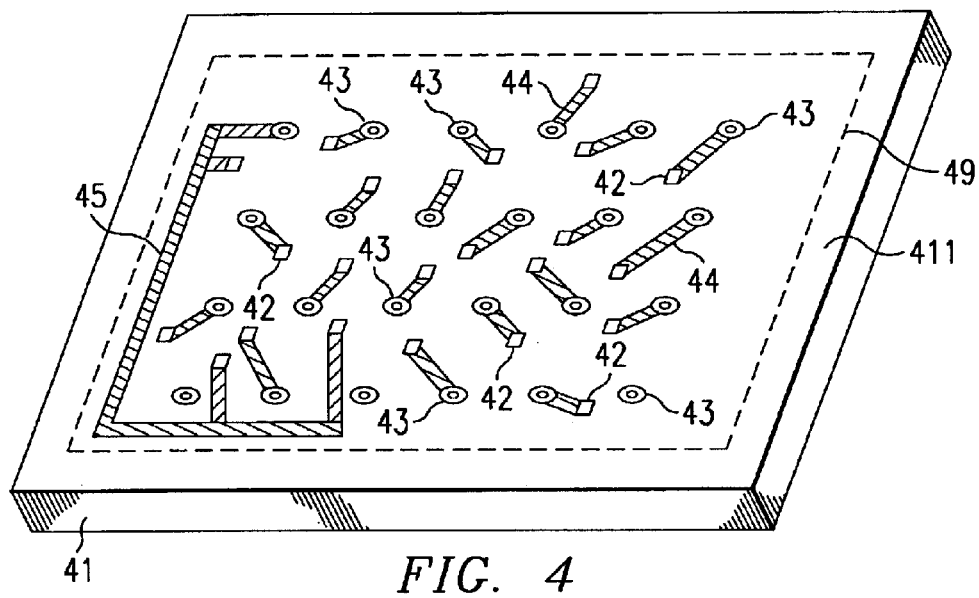
FIG. 4 illustrates the low resistivity electrical interconnection path of the current invention.

FIG. 4 is an example of an interconnection path for a single device on the first surface 441 of a flex film 41. Contact pads 42 are positioned to correspond to chip bump locations. The pads are routed to vias 43 by relatively thick conductive interconnections 44. An option dictated by specific circuit designs may include multiple chip connections to a common interconnection pattern 45. The vias 43 are arrayed in a pattern conforming to industry standards for ball contacts, and are within the perimeter of the chip as depicted by dashed line 49. Solder filled vias 43 provide connection to solder balls on the second surface of the interposer film. Interconnections on the interposer both fan-in and fan-out between the chip contacts and vias so that the length and resistivity of the interconnection is minimized.

Finally, short, broad solder balls on the second surface of the interposer provide contacts to a PCB or other next level of interconnection, and result in a semiconductor device having low resistivity interconnections and inductance.

Many CSP devices known in the industry have realized limited commercial success not only because the packages lack robustness necessary for automated board assembly, but also because the manufacturing technology is not compatible with high volume production techniques known in the industry, and therefore, the manufacturing costs are excessive.

The preferred method and manufacturing process flow of the disclosed flip chip molded CSP includes sprocket driven transport of the substrate or interposer in strip form. FIGS. 5a through 5e schematically illustrate the major assembly steps which are an efficient and cost effective method of production, and are compatible with high volume manufacturing requirements.

Figure 5A:
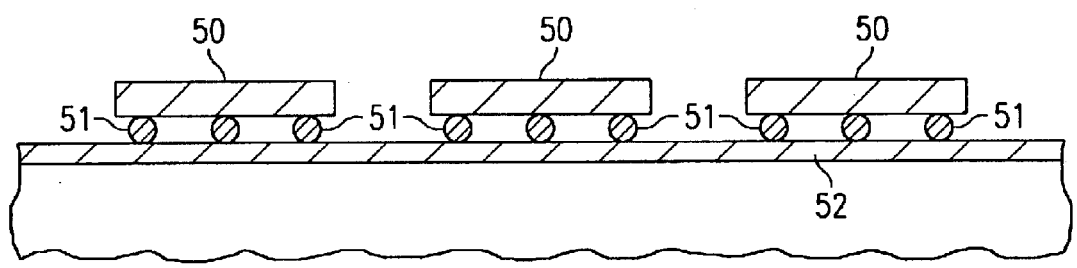
FIGS. 5a through 5e provide a schematic representation of the process flow of the current invention.
Figure 5B:
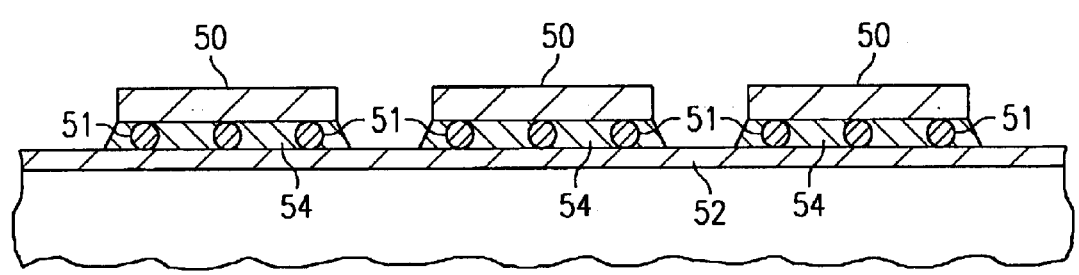

In FIG. 5a, a plurality of IC chips 50 having bump contacts 51 are aligned to receiving pads on a patterned flexible film substrate 52, and the bumps are adhered to the substrate or interposer by thermal processing, preferably a solder reflow procedure known in the industry. In FIG. 5b, an underfill material 54 is dispensed under each chip, and the polymeric material is partially or fully cured using an inline thermal or light source. Fully cross linking the polymeric underfill is not necessary, but instead a quick cure method to "b" stage the polymer is acceptable at the step.

Figure 5C:
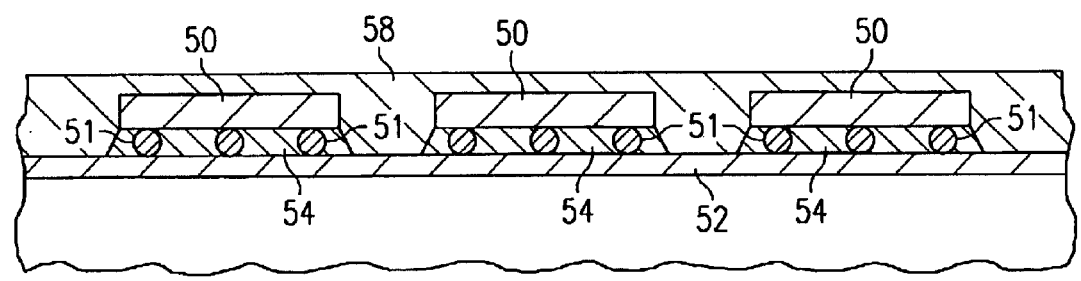

In FIG. 5c, plastic encapsulation 58 of the semiconductor chips 50 attached to the first surface of the flexible tape 52 is accomplished by injecting a molding compound into a mold press fitted with a die having one or more cavities, each of which includes provisions for a large number of devices to be encapsulated simultaneously.

Figure 6:
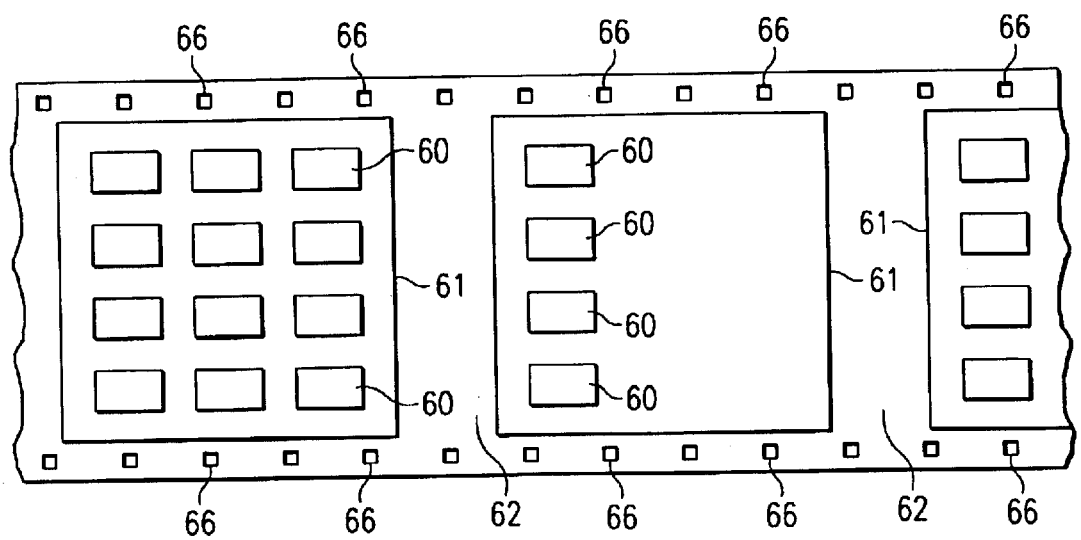
FIG. 6 is a schematic representation of multiple device molding process of the current invention.

As illustrated in FIG. 6, a strip of interposer 62 is positioned in a mold die having one or more cavities 61, and each cavity is designed to mold multiple devices 60 in a single molded unit. The molded unit is outlined by the mold cavity 61. The devices are separated by sawing or other singulation procedures through the mold compound and film.

Figure 5D:
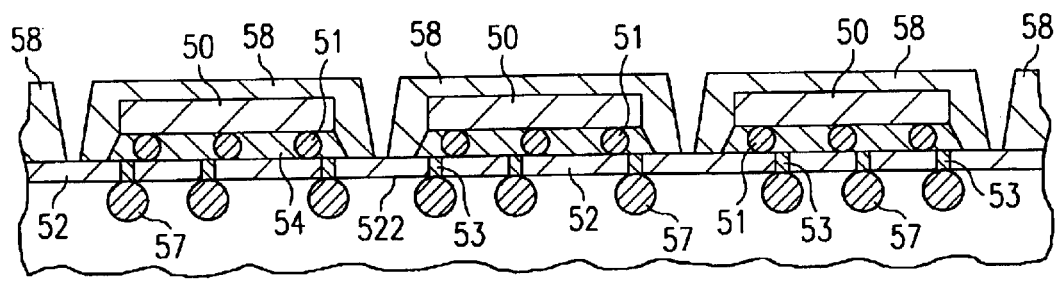

In an alternate embodiment, each cavity includes a plurality of recesses designed to mold individual packages simultaneously. An example of devices molded by the alternate embodiment is depicted in FIG. 5d wherein the mold compound 58 surrounds only the back and sides of each circuit device supported on flex film 52, and the molded devices are physically separated by a section of the film. The alternate embodiment allows easy separation of the devices by cutting or punching in the x and y directions through only the flexible tape separating the devices.

Note in FIG. 6 that edge perforations 66 in the interposer tape support sprocket transport, and allow continuous assembly of a plurality of packaged devices. The flex tape interposer holds the devices and provides clamping locations for the mold press. In an alternate embodiment, strips of tape are transported in carriers through the assembly process.

Mold processes and materials, typically a filled epoxy resin, are consistent with those used throughout the industry for encapsulation of semiconductor devices. The polymeric materials, both underfill and molding compound are cured simultaneously using a batch thermal process.

As shown in FIG. 5d, solder balls 57 are attached at the vias 53 on the second, or unencapsulated surface 522 of the interposer 52. In the preferred embodiment, a solder paste is screened into the vias, and has a small overlap onto the surrounding surface. Solder balls are attached to the paste and are secured using a suitable method, including for example, heating and reflow using any conventional means such as IR, convection, or vapor phase.

Figure 5E:
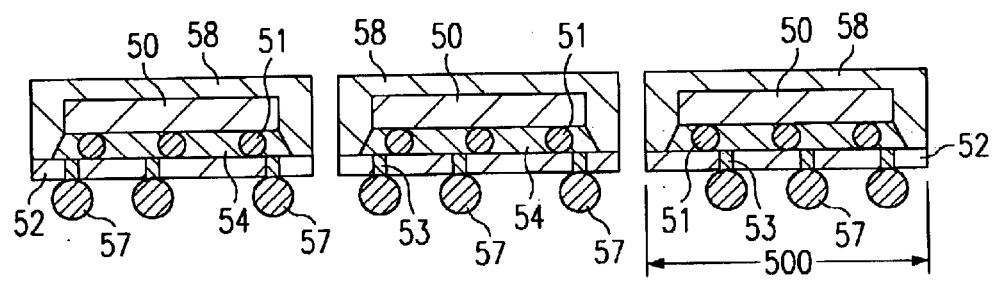

Following ball attachment, the assemblage is then separated in both the x and y direction through the molding compound and tape to form the individual CSP devices 500, as shown in FIG. 5e. Singulation is accomplished using any suitable excising method such as, for example optical or mechanical cutting, sawing, or punching through the mold compound and tape.

The preferred embodiment of a molded flip chip CSP having low inductance interconnections is fabricated in a cost effective manner using the assembly techniques disclosed. However, it should be understood that the various modifications may be made from the details herein without departing from the spirit and scope of the invention as set forth in the appended claims.

What is claimed is:

1. A low inductance, molded CSP (chip scale package) semiconductor device including:
   a) a bumped integrated circuit chip including a front surface, side surfaces, and a back surface,
   b) a flexible film interposer, said chip positioned as a flip chip with said front surface adjacent said interposer,
   c) an underfill material between said front surface of said chip and said interposer,
   d) a molded epoxy encapsulation covering said back surface and said sides of said chip and further the molded epoxy encapsulation having a flat side surface perpendicular to said back surface, and
   e) external solder ball connectors on said interposer.

2. The device of claim 1, wherein said interposer comprises vias through which said bumped integrated circuit is coupled to said external solder ball connectors.

3. The device of claim 2, wherein said vias are filled with solder paste.

4. The device of claim 2, wherein at least some of said external solder ball connectors are attached to said interposer at said vias.

5. The device of claim 1, wherein said bumped integrated circuit chip includes solder bump contacts.

6. The device of claim 1, wherein said interposer comprises metallized lands on said second surface to which said external solder ball connectors may be attached.

7. The device of claim 1, wherein said interposer comprises multiple layers of metal separated by dielectric layers.

8. The device of claim 1, wherein molded epoxy encapsulation covers said back surface in a thickness in the range of 0.25 mm to 0.6 mm.

9. A low inductance, molded CSP (chip scale package) semiconductor device including:
   a) an integrated circuit chip with a plurality of bump contacts, said chip including a front surface, side surfaces, and a back surface;
   b) a flexible film interposer having first and second surfaces, said interposer including a plurality of metal lands on said front surface, said chip positioned with said front surface adjacent said first surface of said interposer such that at least some of said plurality of bump contacts on said chip align with said metal lands on said front surface;
   c) an underfill material between said front surface of said chip and said interposer;
   d) a molded epoxy encapsulation covering said back surface and said sides of said chip and further the molded epoxy encapsulation having a flat side surface perpendicular to said back surface; and
   e) a plurality of external solder ball connectors on said second surface of said interposer.

10. The device of claim 9, wherein said interposer comprises vias through which at least some of said metal lands are connected to at least some of said plurality of external solder ball connectors.

11. The device of claim 10, wherein said vias are filled with solder paste.

12. The device of claim 10, wherein at least some of said external solder ball connectors are attached to said interposer at said vias.

13. The device of claim 9, wherein said bump contacts are solder.

14. The device of claim 9, wherein said interposer comprises metallized lands on said second surface to which said external solder ball connectors are attached.

15. The device of claim 9, wherein said interposer comprises multiple layers of metal separated by dielectric layers.

16. The device of claim 9, wherein molded epoxy encapsulation covers said back surface in a thickness in the range of 0.25 mm to 0.6 mm.

* * * * *